United States Patent
You et al.

(10) Patent No.: US 9,406,553 B2
(45) Date of Patent: Aug. 2, 2016

(54) SEMICONDUCTOR DEVICES AND METHODS OF FABRICATING THE SAME

(71) Applicant: SAMSUNG ELECTRONICS CO., LTD., Suwon-si, Gyeonggi-do (KR)

(72) Inventors: Wookyung You, Suwon-si (KR); Sanghoon Ahn, Goyang-si (KR); Sangho Rha, Seongnam-si (KR); Jongmin Baek, Suwon-si (KR); Nae-In Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/595,662

(22) Filed: Jan. 13, 2015

(65) Prior Publication Data

US 2015/0287628 A1 Oct. 8, 2015

(30) Foreign Application Priority Data

Apr. 7, 2014 (KR) ........................ 10-2014-0041157

(51) Int. Cl.
| | | |
|---|---|---|
| H01L 21/768 | (2006.01) | |
| H01L 23/522 | (2006.01) | |
| H01L 23/528 | (2006.01) | |
| H01L 23/532 | (2006.01) | |
| H01L 23/485 | (2006.01) | |

(52) U.S. Cl.
CPC ...... *H01L 21/7682* (2013.01); *H01L 21/76816* (2013.01); *H01L 21/76831* (2013.01); *H01L 21/76837* (2013.01); *H01L 21/76879* (2013.01); *H01L 23/5222* (2013.01); *H01L 23/53295* (2013.01); *H01L 23/485* (2013.01); *H01L 23/5226* (2013.01); *H01L 23/53223* (2013.01); *H01L 23/53238* (2013.01); *H01L 23/53266* (2013.01)

(58) Field of Classification Search
CPC .............. H01L 23/5226; H01L 23/528; H01L 23/53295; H01L 23/7682; H01L 21/56737; H01L 21/56381; H01L 23/481; H01L 3/48627; H01L 21/76879; H01L 23/485; H01L 23/53238; H01L 23/53223; H01L 23/53266; H01L 23/5222
See application file for complete search history.

(56) References Cited

U.S. PATENT DOCUMENTS

| | | | |
|---|---|---|---|
| 7,056,822 B1 | 6/2006 | Zhao | |
| 7,642,619 B2 | 1/2010 | Matz et al. | |
| 7,741,228 B2 | 6/2010 | Ueki et al. | |
| 8,034,693 B2 | 10/2011 | Shibata et al. | |
| 8,329,582 B2 | 12/2012 | Kim | |
| 2005/0017280 A1* | 1/2005 | Lee ................... | H01L 27/10885 257/296 |
| 2011/0312172 A1* | 12/2011 | Park .................. | H01L 21/3086 438/594 |
| 2012/0241838 A1 | 9/2012 | Nagashima et al. | |
| 2012/0280325 A1 | 11/2012 | Kim et al. | |

FOREIGN PATENT DOCUMENTS

| | | |
|---|---|---|
| JP | 2012-049290 | 3/2012 |
| KR | 1020030083174 | 10/2003 |
| KR | 1020100122700 | 11/2010 |

* cited by examiner

*Primary Examiner* — Jasmine Clark
(74) *Attorney, Agent, or Firm* — F. Chau & Associates, LLC

(57) ABSTRACT

A semiconductor device includes a substrate including a first region and a second region, first conductive patterns disposed on the first region and spaced apart from each other by a first distance, second conductive patterns disposed on the second region and spaced apart from each other by a second distance greater than the first distance, and an interlayer insulating layer disposed between the second conductive patterns and including at least one recess region having a width corresponding to the first distance.

13 Claims, 14 Drawing Sheets

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0041157, filed on Apr. 7, 2014, in the Korean Intellectual Property Office, the disclosure of which is incorporated by reference herein in its entirety.

TECHNICAL FIELD

The inventive concept relates to semiconductor devices and methods of fabricating the same.

DISCUSSION OF RELATED ART

Semiconductor devices may be required to have higher integration, higher density, lower power consumption, and/or faster operating speeds. A semiconductor device with highly integrated circuits may include a multi-layered interconnection structure, which may be formed of a metal material (e.g., aluminum). The formation of aluminum interconnection lines may include depositing an aluminum layer on an insulating layer and etching the aluminum layer to expose the insulating layer.

As semiconductor devices shrink, copper (instead of aluminum) may be used as a material for the interconnection lines. This may be due to the relatively high electrical resistivity of aluminum. For example, as a width of an aluminum interconnection line decreases, its resistance increases, and thus semiconductor devices with higher operating speeds may not be easily developed. Copper, on the other hand, may be cheaper and have better electrical conductivity, but may not be easily patterned using an etching technique. Although a damascene process may also be used to form copper interconnection lines.

Further, even if copper interconnection lines are used, as the spacing between the interconnection lines becomes narrower, there may exist electrical interference between the interconnection lines and/or a delay in a signal transmission speed.

SUMMARY

An exemplary embodiment of the inventive concept may provide a semiconductor device with an increased signal transmission speed.

An exemplary embodiment of the inventive concept may provide a method of fabricating a semiconductor device through forming air gap regions between interconnection lines that are spaced apart from each other at various distances.

In an exemplary embodiment of the inventive concept, a semiconductor device may include a substrate including a first region and a second region; first conductive patterns disposed on the first region and spaced apart from each other by a first distance; second conductive patterns disposed on the second region and spaced apart from each other by a second distance greater than the first distance; and an interlayer insulating layer disposed between the second conductive patterns and including at least one recess region having a width corresponding to the first distance.

In an exemplary embodiment of the inventive concept, the semiconductor device may further include: a first air gap disposed between two of the first conductive patterns; and a second air gap disposed in the recess region.

In an exemplary embodiment of the inventive concept, the semiconductor device may further include a diffusion barrier insulating layer overlapping a top surface of the interlayer insulating layer, a side surface of the recess region, and top and side surfaces of the first conductive patterns. The first and second air gaps may be formed by the diffusion barrier insulating layer.

In an exemplary embodiment of the inventive concept, the semiconductor device may further include a mask pattern disposed between the diffusion barrier insulating layer and the top surface of the interlayer insulating layer and between the diffusion barrier insulating layer and top surfaces of the second conductive patterns.

In an exemplary embodiment of the inventive concept, the semiconductor device may further include: a first protection layer disposed between the diffusion barrier insulating layer and top surfaces of the second conductive patterns; and a second protection layer disposed between the diffusion barrier insulating layer and the top surface of the interlayer insulating layer.

In an exemplary embodiment of the inventive concept, the diffusion barrier insulating layer may be in contact with the top surface of the interlayer insulating layer.

In an exemplary embodiment of the inventive concept, at least one of the second conductive patterns may include a conductive plug and the recess region is spaced apart from the conductive plug.

In an exemplary embodiment of the inventive concept, a method of fabricating a semiconductor device may include forming an interlayer insulating layer on a substrate including a first region and a second region, the interlayer insulating layer filling a space between first conductive patterns on the first region and a space between second conductive patterns on the second region, the first conductive patterns being spaced apart from each other by a first distance and the second conductive patterns being spaced apart from each other by a second distance greater than the first distance; etching the interlayer insulating layer to expose sidewalls of the first conductive patterns and form at least one recess region disposed between the second conductive patterns, the recess region having a width corresponding to the first distance; and forming a diffusion barrier insulating layer on the substrate, the diffusion barrier insulating layer forming a first gap between two of the first conductive patterns and a second gap in the recess region.

In an exemplary embodiment of the inventive concept, the forming of the interlayer insulating layer, the first conductive patterns, and the second conductive patterns may include: forming an interlayer insulating layer having first groove regions on the first region and second groove regions on the second region, the first groove regions being spaced apart from each other by the first distance and the second groove regions being spaced apart from each other by second distance; and forming the first conducive patterns in the first groove regions and the second conductive patterns in the second groove regions.

In an exemplary embodiment of the inventive concept, the method may further include, before the forming of the at least one recess region, forming a mask pattern on the interlayer insulating layer to cover the second region and expose the first region and an area of the second region corresponding to the at least one recess region. The etching of the interlayer insulating layer may be performed using the mask pattern as an etch mask.

In an exemplary embodiment of the inventive concept, the diffusion barrier insulating layer may be formed on the mask pattern.

In an exemplary embodiment of the inventive concept, the method may further include forming a protection layer covering top surfaces of the first and the second conductive patterns before the forming of the at least one recess region.

In an exemplary embodiment of the inventive concept, the protection layer may be formed of metallic elements including tantalum (Ta), ruthenium (Ru), cobalt (Co), manganese (Mn), titanium (Ti), tungsten (W), nickel (Ni), or aluminum (Al), oxides of the metallic elements, nitrides of the metallic elements, or oxynitrides of the metallic elements.

In an exemplary embodiment of the inventive concept, the diffusion barrier insulating layer may be formed of silicon carbon nitride (SiCN), silicon nitride (Sin or silicon oxycarbide (SiOC).

In an exemplary embodiment of the inventive concept, a semiconductor device may include: a plurality of first conductive patterns disposed on a substrate and separated from each other by a first distance; a plurality of second conductive patterns disposed on the substrate and separated from each other by a second distance greater than the first distance; a diffusion barrier insulating layer disposed on top of the second conductive patterns; and an interlayer insulating layer disposed between the substrate and the diffusion barrier insulating layer, the interlayer insulating layer having a first recess disposed between two of the second conductive patterns.

In an exemplary embodiment of the inventive concept, the semiconductor device may further include a protective layer that includes metal disposed between the diffusion barrier insulating layer and the interlayer insulating layer.

In an exemplary embodiment of the inventive concept, the diffusion barrier insulating layer may include silicon.

In an exemplary embodiment of the inventive concept, the first recess may include a first air gap.

In an exemplary embodiment of the inventive concept, a second recess may be disposed between two of the first conductive patterns, and the first and second recesses may have substantially the same width.

In an exemplary embodiment of the inventive concept, a second air gap may be disposed in the second recess.

BRIEF DESCRIPTION OF THE DRAWINGS

The above and other features of the inventive concept will become more apparent by describing exemplary embodiments thereof with reference to the accompanying drawings in which.

DETAILED DESCRIPTION OF THE EMBODIMENTS

Figure 1:
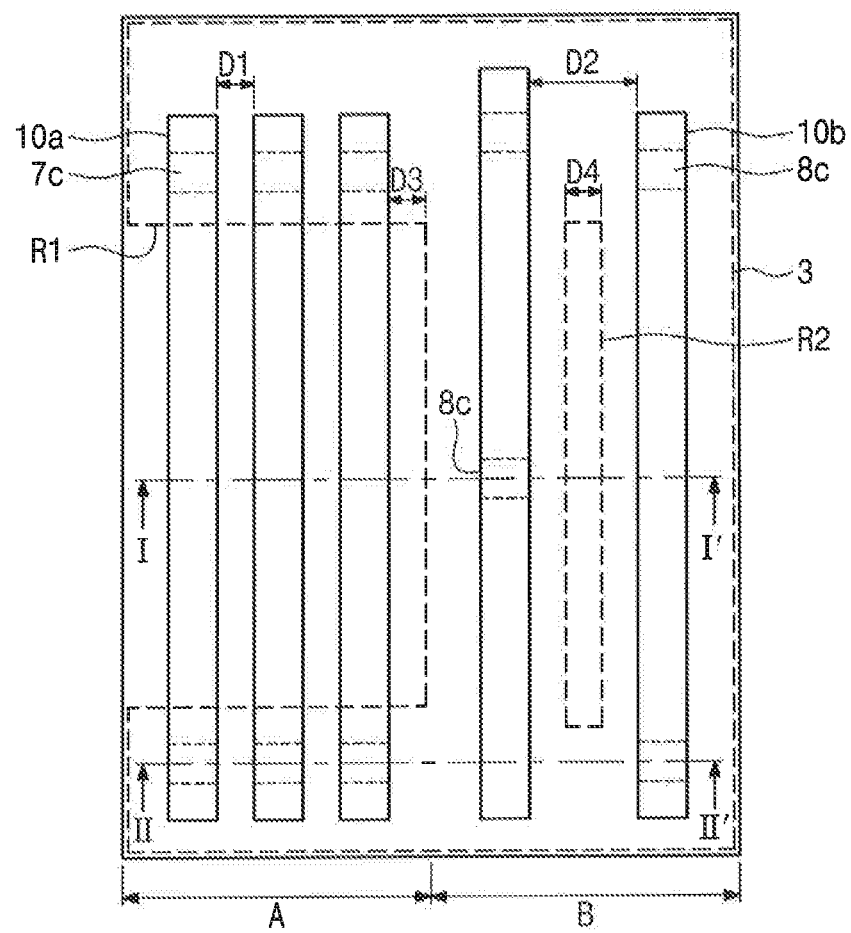
FIG. 1 is a plan view of a semiconductor device according to an exemplary embodiment of the inventive concept.

Exemplary embodiments of the inventive concept will now be described more fully hereinafter with reference to the accompanying drawings. It should be noted, however, that the inventive concept is not limited to the following exemplary embodiments, and may be implemented in various forms. In the drawings, the sizes and relative sizes of layers and regions may be exaggerated for clarity.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present.

Additionally, shapes of the views of the inventive concept may be modified according to manufacturing techniques and/or allowable errors. Therefore, the embodiments of the inventive concept are not limited to the specific shapes illustrated in the views, but may include other shapes that may be created according to manufacturing processes. For example, an etching region illustrated as a rectangle may have rounded or curved features.

The same reference numerals or the same reference designators may denote the same elements throughout the specification and drawings.

Additionally, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern depending on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
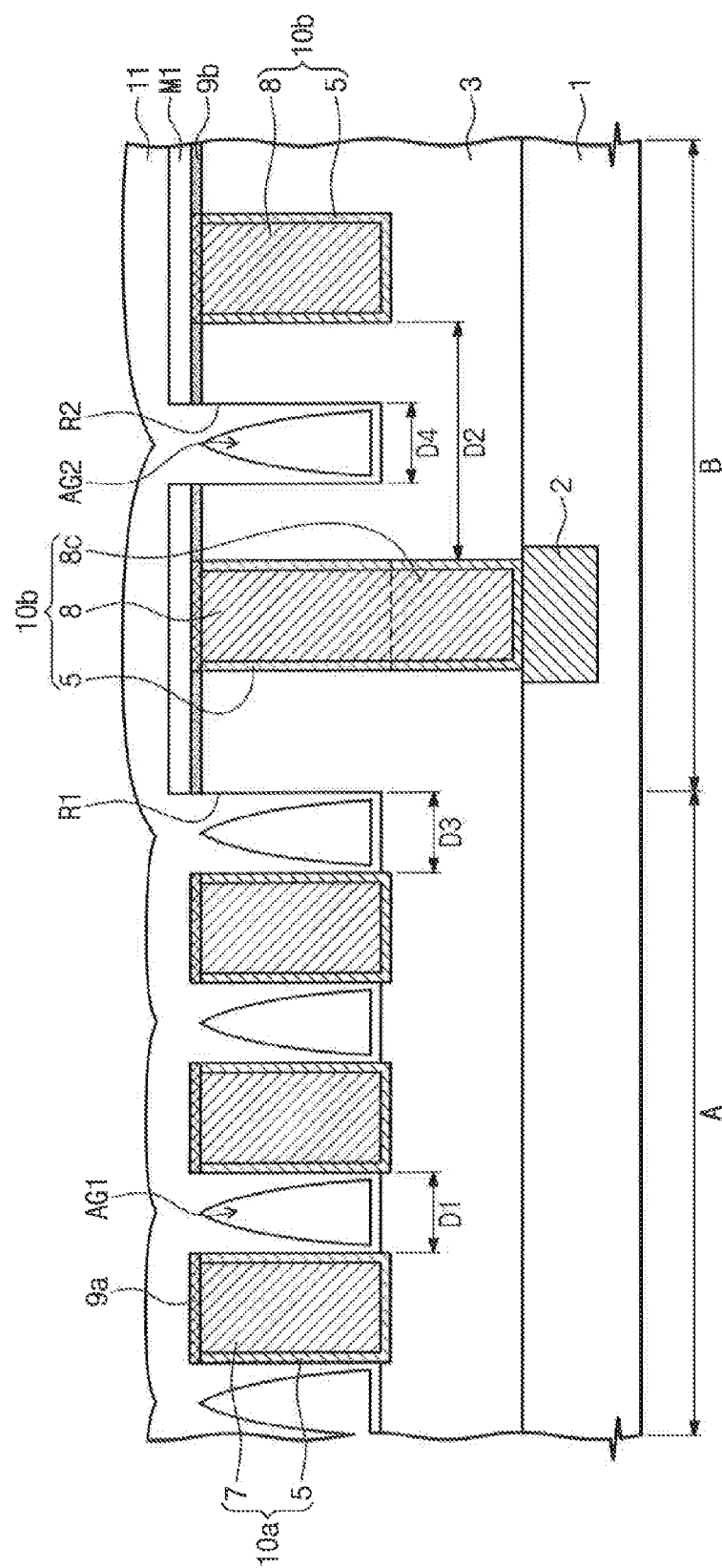
FIG. 2A is a cross-sectional view taken along line I-I' of FIG. 1, according to an exemplary embodiment of the inventive concept.
Figure 2B:
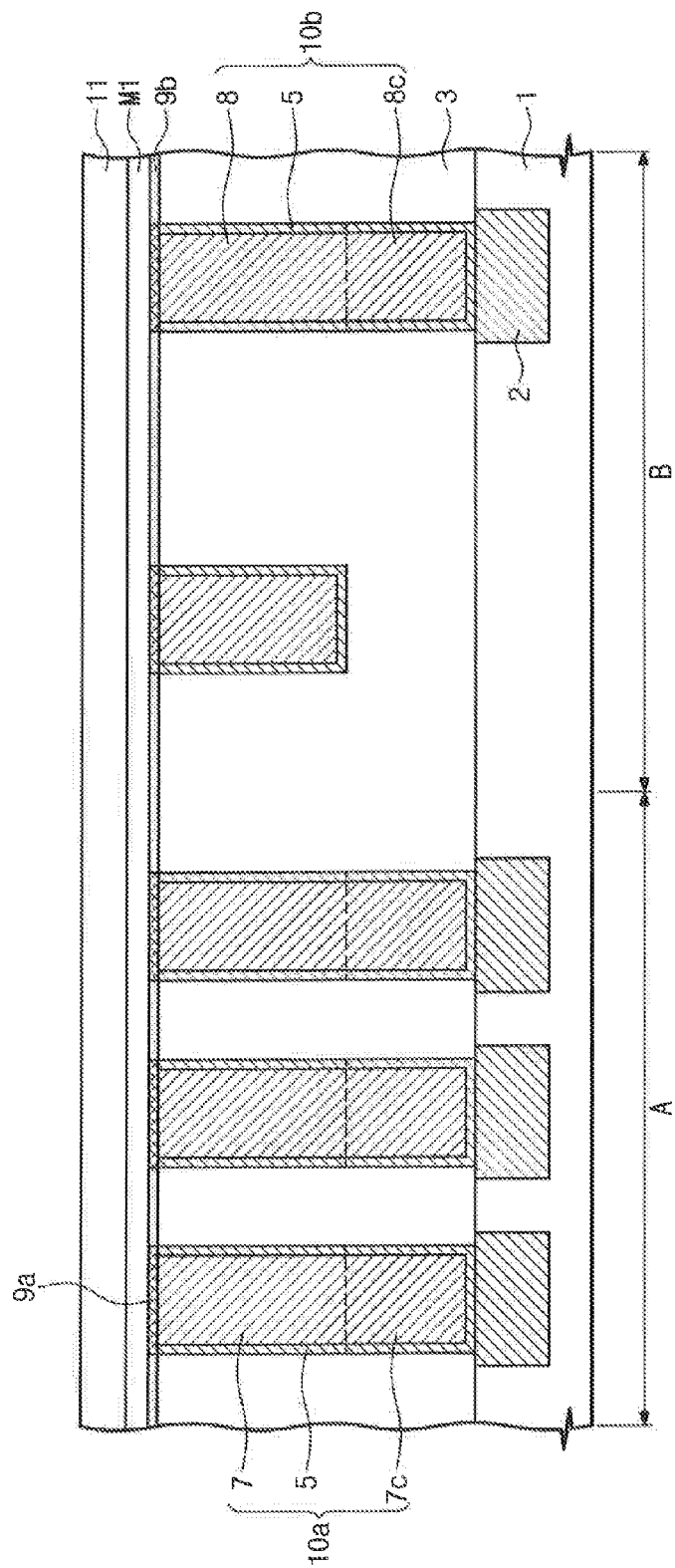
FIG. 2B is a cross-sectional view taken along lines II-II' of FIG. 1, according to an exemplary embodiment of the inventive concept.

FIG. 1 is a plan view of a semiconductor device according to an exemplary embodiment of the inventive concept. FIG. 2A is a cross-sectional view taken along line I-I' of FIG. 1, according to an exemplary embodiment of the inventive concept. FIG. 2B is a cross-sectional view taken along line of FIG. 1, according to an exemplary embodiment of the inventive concept.

Referring to FIGS. 1, 2A, and 2B, a substrate 1 including a first region A and a second region B may be provided. Although not shown in FIGS. 1, 2A, and 2B, transistors and a device isolation layer may be disposed on the substrate 1. The substrate 1 may include a conductive portion 2. The conductive portion 2 may correspond to one of gate, source, and drain electrodes of a transistor or a wiring such as a common source line. Alternatively, the substrate 1 may include an insulating layer and the conductive portion 2 disposed in the insulating layer to serve as a wiring, a pad, a contact plug, or a via plug. An interlayer insulating layer 3 may be disposed on the substrate 1. For example, the interlayer insulating layer 3 may be formed of an insulating material such as silicon oxide.

First conductive patterns 10a and second conductive patterns 10b may be disposed in the interlayer insulating layer 3 and on the first region A and the second region B, respectively. The first conductive patterns 10a may include a first wiring portion 7, a first conductive plug 7c disposed under a portion of the first wiring portion 7, and a diffusion barrier metal layer 5 conformally covering the first wiring portion 7 and a sidewall and a lower surface of the first conductive plug 7c. The second conductive patterns 10b may include a second wiring portion 8, a second conductive plug 8c disposed under a portion of the second wiring portion 8, and a diffusion barrier metal layer 5 conformally covering the second wiring portion 8 and a sidewall and a lower surface of the second conductive plug 8c. The first conductive patterns 10a may be spaced apart from each other by a first distance D1. The second conductive patterns 10b may be spaced apart from each other by a second distance D2 greater than the first distance D1. The first and second wiring portions 7 and 8 may be formed of the same material as the first and second conductive plugs 7c and 8c. For example, the first and second wiring portions 7 and 8 and the first and second conductive plugs 7c and 8c may be formed of a metallic material such as copper, aluminum, or tungsten. The first and second conductive plugs 7c and 8c may correspond to contact plugs or via plugs. The diffusion barrier metal layer 5 may be formed of titanium (Ti), titanium nitride (TiN), tantalum (Ta), tantalum nitride (TiN), ruthenium (Ru), cobalt (Co), manganese (Mn), tungsten nitride (WN), nickel (Ni), or nickel boron (NiB).

The interlayer insulating layer 3 in the first region A and the second region B may include a first recess region R1 and a second recess region R2, respectively. The first recess region R1 may be a portion of the first region A. The interlayer insulating layer 3 may cover the first conductive plug 7c and sidewalls of the first wiring portion 7 adjacent the first conductive plug 7c. The first wiring portion 7 spaced apart from the first conductive plug 7c may be disposed in the first recess region R1. Sidewalls of the first conductive patterns 10a may be exposed by the interlayer insulating layer 3. A sidewall of the outermost first conductive pattern 10a may be spaced apart from a sidewall of the first recess region R1 by a third distance D3. The third distance D3 may be substantially the same as the first distance D1. Regardless of positions of sidewalls of the second conductive patterns 10b, the sidewalls of the second conductive patterns 10b may be covered by the interlayer insulating layer 3. The second recess region R2 may be disposed between two of the second conductive patterns 10b. The second recess region R2 may be formed in a line shape, in a plan view. A forth distance D4 between both sidewalls of the second recess region R2 may be substantially the same as the first distance D1. A depth of the first recess region R1 may be substantially the same as a depth of the second recess region R2.

A first protection layer 9a may be disposed on each of the first conductive patterns 10a and the second conductive patterns 10b. A second protection layer 9b may be disposed on the interlayer insulating layer 3.

For example, the first protection layer 9a may be formed of tantalum (Ta), ruthenium (Ru), cobalt (Co), manganese (Mn), titanium (Ti), tungsten (W), nickel (Ni), or aluminum (Al), or nitrides thereof. The second protection layer 9b may be formed of oxides or nitrides of metal contained in the first protection layer 9a. For example, the first protection layer 9a may be formed of aluminum nitride and the second protection layer 9b may be formed of aluminum oxynitride.

A mask pattern M1 may be disposed on the second region B to cover the first protection layer 9a and the second protection layer 9b. A diffusion barrier insulating layer 11 may be disposed on the first conductive patterns 10a and the second conductive patterns 10b. The diffusion barrier insulating layer 11 may extend between the first conductive patterns 10a to define a first air gap region AG1 in the first recess region R1. Further, the diffusion barrier insulating layer 11 may be formed to define a second air gap region AG2 in the second recess region R2. The diffusion barrier insulating layer 11 may be formed of silicon carbonitride (SiCN), silicon nitride (SiN), or silicon oxycarbide (SiOC).

According to an exemplary embodiment of the inventive concept, the second air gap region AG2 may be formed on the second region B, on which wirings (e.g., the second conductive patterns 10b) are spaced apart from each other by a relatively large distance. This way, a signal transmission speed via the wirings can be increased. The first distance D1 between the first conductive patterns 10a may be substantially the same as the forth distance D4 (e.g., the width of the second recess region R2) between both sidewalls of the second recess region R2. Therefore, shapes of the first air gap regions AG1 may be substantially similar to a shape of the second air gap region AG2.

In the case where the interlayer insulating layer 3 and the second recess region R2 are not provided between the second conductive patterns 10b, it may not be easy to form the second air gap region AG2. Even when the second air gap region AG2 can be formed between the second conductive patterns 10b, a subsequent wiring process may involve complications. For example, the second air gap region AG2 may be formed to have a top level exposed by a space between the second conductive patterns 10b. In this case, abnormalities such as an electrical bridge between wirings may occur in a subsequent wiring process for forming upper wirings on the second conductive patterns 10b. However, according to an exemplary embodiment of the inventive concept, a subsequent wiring process may not involve complications.

FIGS. 3, 4, 5, 6 and 7 illustrate a method of fabricating a semiconductor device having the cross-sectional view illustrated in FIG. 2A, according to an exemplary embodiment of the inventive concept.

Figure 3:
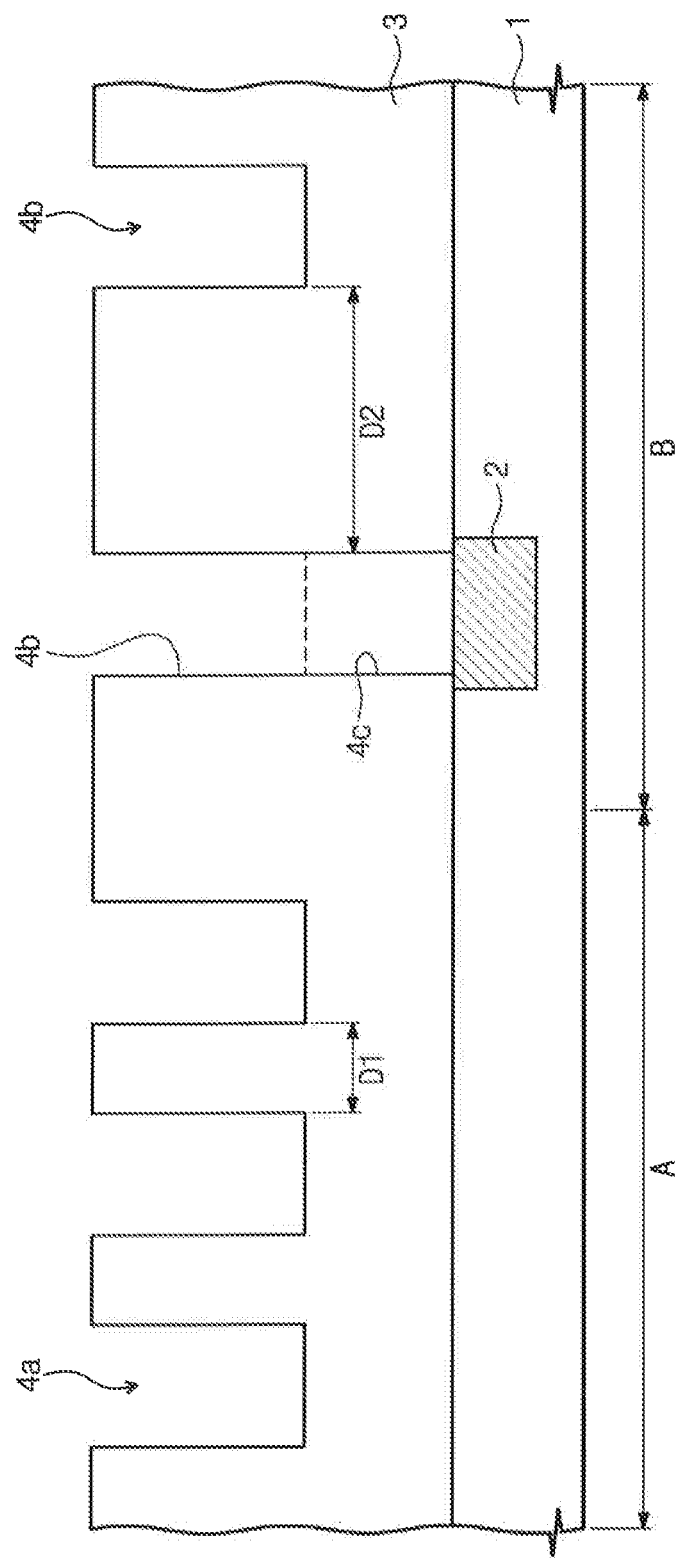
FIGS. 3, 4, 5, 6 and 7 illustrate a method of fabricating a semiconductor device having the cross-sectional view illustrated in FIG. 2A, according to an exemplary embodiment of the inventive concept.

Referring to FIG. 3, a substrate 1 having a first region A and a second region B may be provided. A conductive portion 2 may be formed in the substrate 1. The substrate 1 may be provided to have the same or similar features as that described with reference to FIG. 2A. An interlayer insulating layer 3 may be formed on the substrate 1. The interlayer insulating layer 3 may be patterned to form groove regions 4a and 4b and a hole 4c. The groove regions 4a and 4b include first groove regions 4a disposed on the first region A and second groove regions 4b disposed on the second region B. The hole 4c may be formed under a portion of each of the first and second groove regions 4a and 4b. The hole 4c may be formed to expose at least a portion of the conductive portion 2. A first distance D1 between the first groove regions 4a may be less than a second distance D2 between the second groove regions 4b.

Figure 4:
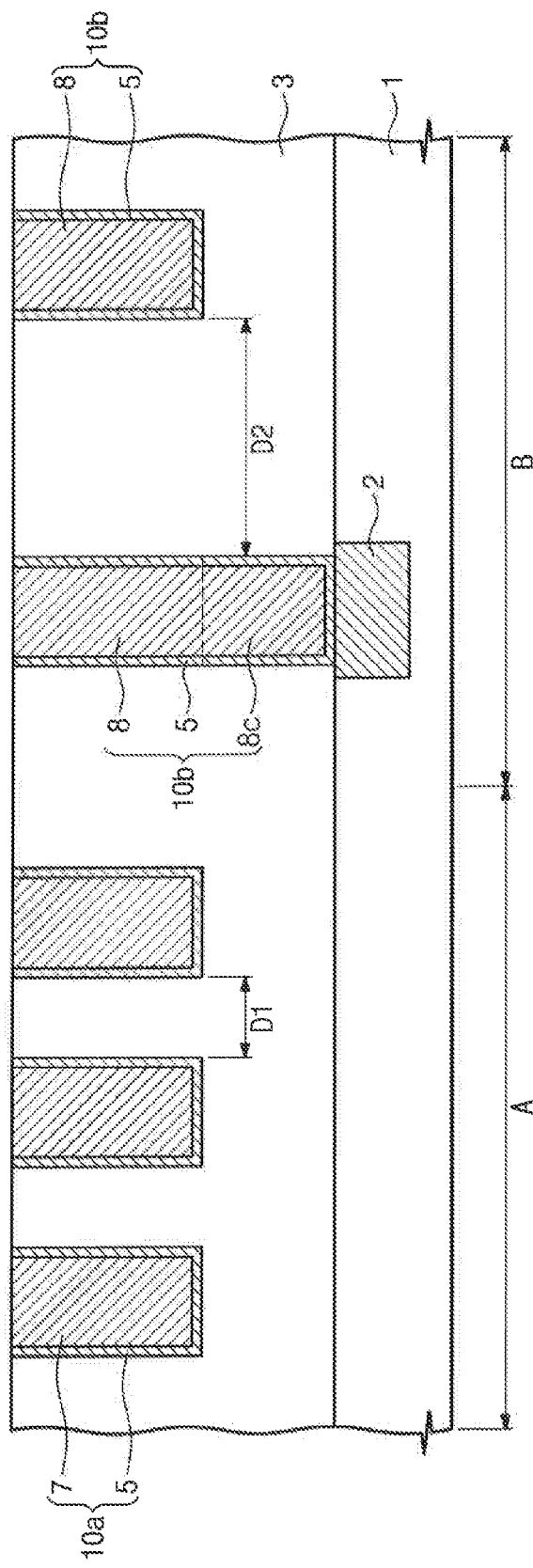

Referring to FIG. 4, a diffusion barrier metal layer 5 may be conformally formed on the interlayer insulating layer 3, and then a conductive layer may be stacked on the diffusion barrier metal layer 5 to fill the first and second groove regions 4a and 4b and the hole 4c. A polishing process for planarizing the diffusion barrier metal layer 5 and the conductive layer may be performed to expose a top surface of the interlayer insulating layer 3. Accordingly, the diffusion barrier metal layer 5 and interconnection portions 7 and 8 may be formed in the groove regions 4a and 4b, and the diffusion barrier metal layer 5 and first and second conductive plugs 7c and 8c of FIG. 1 may be formed in the hole 4c. In other words, the first conductive patterns 10a may be formed in the first groove regions 4a and the second conductive patterns 10b may be formed in the second groove regions 4b. Here, a distance between the first conductive patterns 10a may correspond to a distance between the first groove regions 4a and a distance between the second conductive patterns 10b may correspond to a distance between the second groove regions 4b. In other words, the distance between the first conductive patterns 10a may be denoted by the first distance D1 and the distance between the second conductive patterns 10b may be denoted by the second distance D2.

Figure 5:
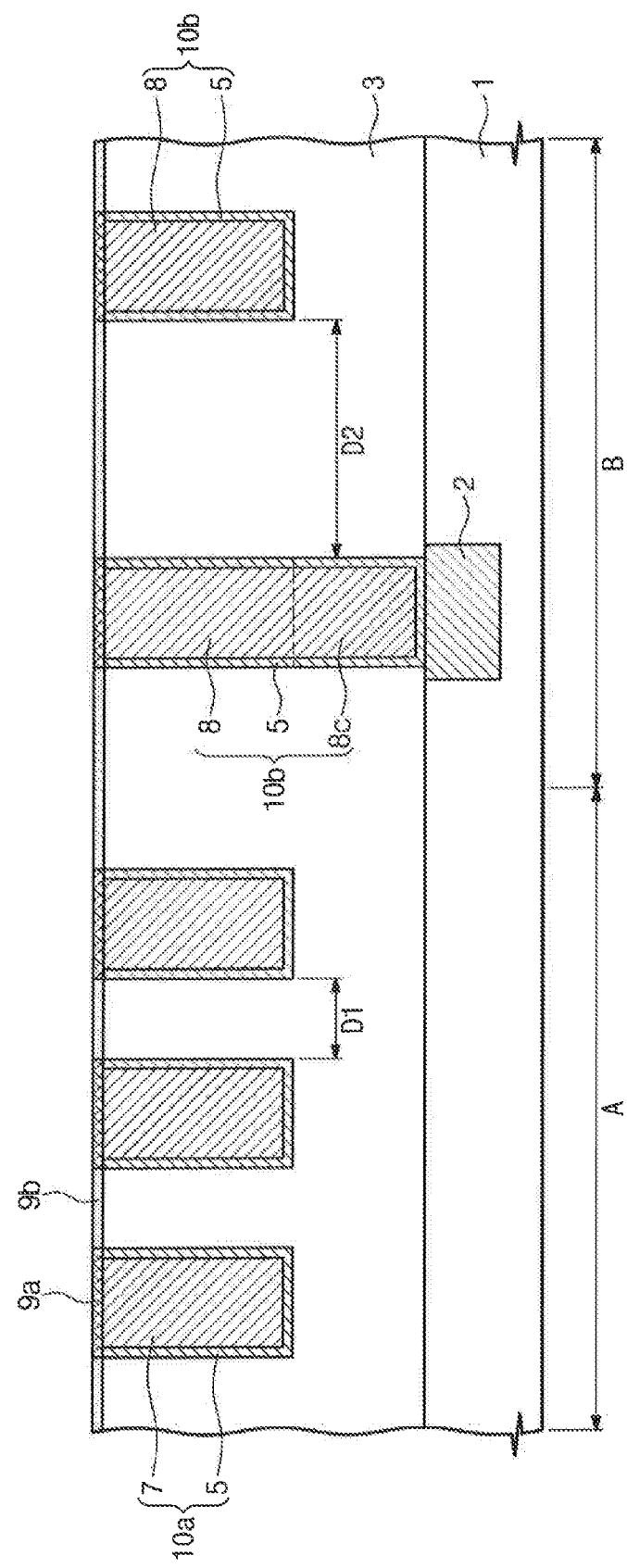

Referring to FIG. 5, protection layers 9a and 9b may be formed on the first and second conductive patterns 10a and 10b. For example, the protection layers 9a and 9b may be formed by a deposition process. The deposition process may be a chemical vapor deposition (CVD) process, an atomic layer deposition (ALD) process, or an electroplating process. A metal layer (e.g., of cobalt (Co)) may be deposited to form the protection layers 9a and 9b. The deposition of the cobalt layer may be performed in such a way that the cobalt layer is selectively deposited on a metal material (e.g., the first and second conductive patterns 10a and 10b) but is not deposited on an insulating material (e.g., the interlayer insulating layer 3). Therefore, a first protection layer 9a consisting of cobalt may be formed on the first and second conductive patterns 10a and 10b, but a second protection layer 9b may not be formed on the interlayer insulating layer 3. Alternatively, an aluminum nitride layer may be deposited to form the protection layers 9a and 9b. In the case where the aluminum nitride layer is deposited on the first and second conductive patterns 10a and 10b, it may be a pure aluminum nitride layer. However, in the case where the aluminum nitride layer is deposited on the interlayer insulating layer 3, which is an oxide-based material, a reaction of a precursor for depositing the aluminum nitride layer may be different from that on the first and second conductive patterns 10a and 10b. For example, an aluminum oxynitride layer may be deposited on the interlayer insulating layer 3. In other words, the first protection layer 9a of aluminum nitride may be formed on the first and second conductive patterns 10a and 10b, while the second protection layer 9b of aluminum oxynitride may be formed on the interlayer insulating layer 3. Accordingly, an etch rate of the first protection layer 9a may be different from that of the second protection layer 9b.

Figure 6:
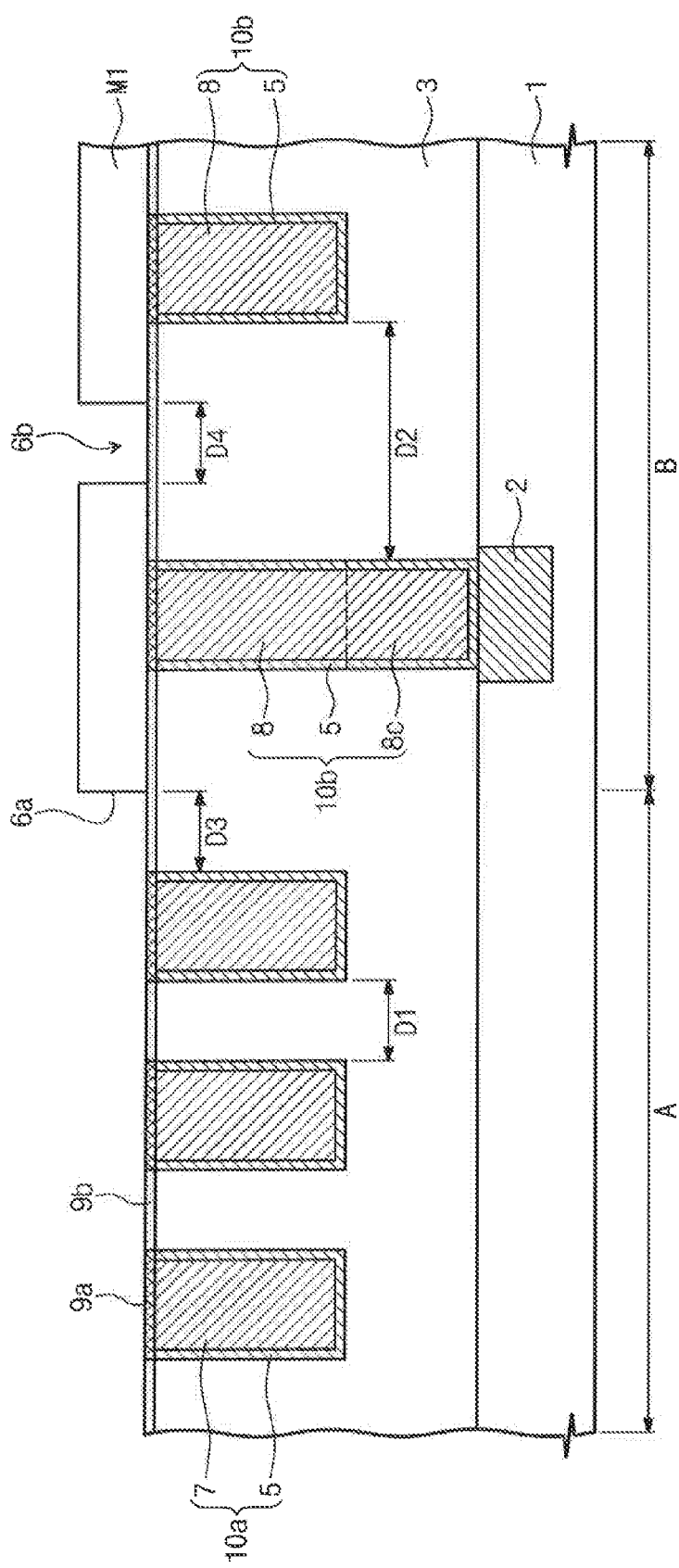

Referring to FIG. 6, a mask pattern M1 may be formed on the substrate 1. The mask pattern M1 may be formed to cover the first and second conductive plugs 7c and 8c of FIG. 1 and regions adjacent to the first and second conductive plugs 7c and 8c of FIG. 1. The mask pattern M1 may be formed to have first and second openings 6a and 6b. The first and second openings 6a and 6b will be used to form first and second recess regions R1 and R2 in a subsequent process. The shortest distance (e.g., a third distance D3) between the first opening 6a and the first conductive pattern 10a may be substantially the same as the first distance D1. A forth distance D4 between both sidewalls of the second opening 6b may be substantially the same as the first distance D1. The mask pattern M1 may include a plurality of layers.

Figure 7:
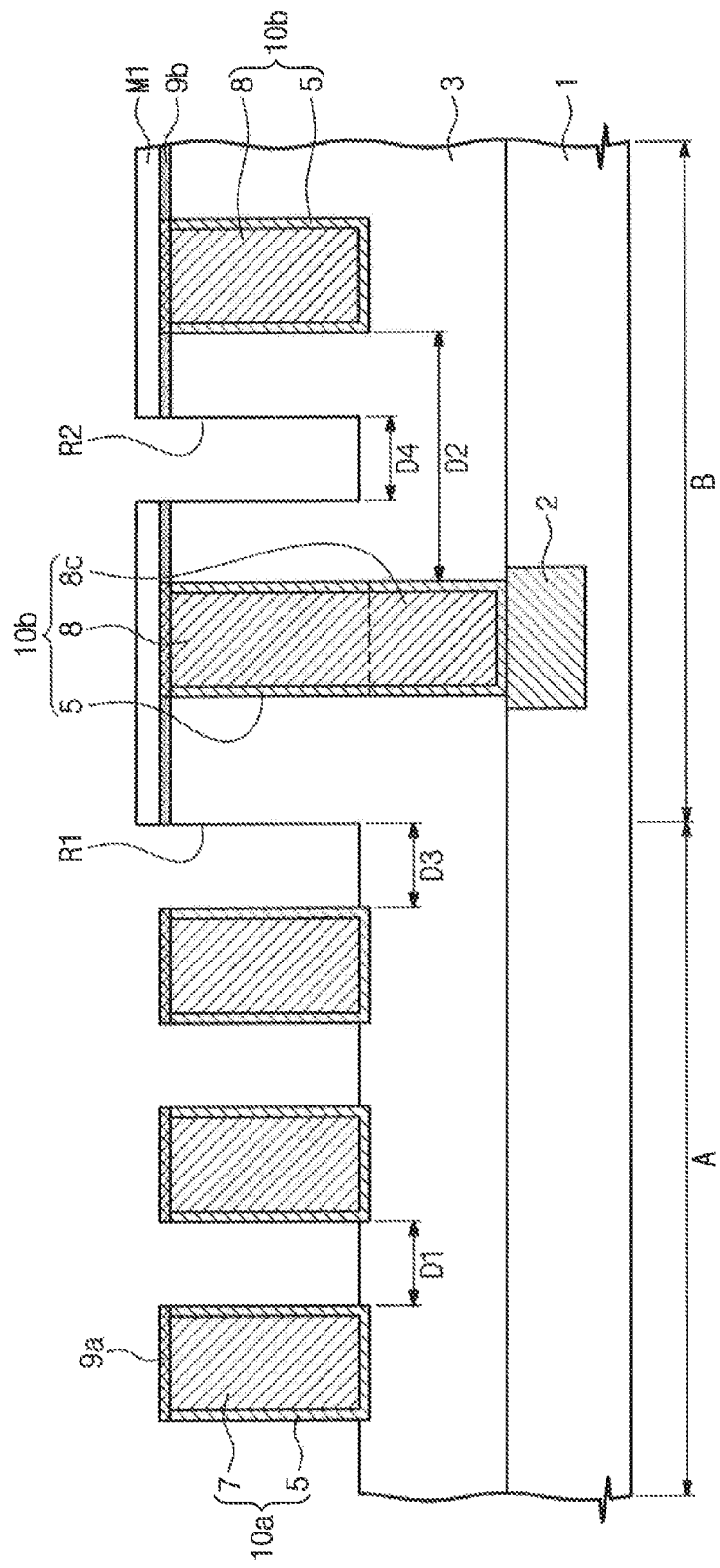

Referring to FIG. 7, the interlayer insulating layer 3 may be etched using the mask pattern M1 as an etch mask to form a first recess region R1 and a second recess region R2. Further, the etching of the interlayer insulating layer 3 may be performed to remove the second protection layer 9b exposed by the mask pattern M1. During the etching of the interlayer insulating layer 3, the first protection layer 9a may not be removed and remain on the first conductive patterns 10a, and thus, the first conductive patterns 10a may be protected by the first protection layer 9a. A thickness of the mask pattern M1 may be decreased during the etching process. Sidewalls of the first conductive patterns 10a may be exposed by the first recess region R1. The second recess region R2 may be formed between the second conductive patterns 10b. A width D4 of the second recess region R2 may correspond to the first distance D1 between the first conductive patterns 10a. A depth of the first recess region R1 may be substantially the same as that of the second recess region R2.

Referring again to FIG. 2A, a diffusion barrier insulating layer 11 may be formed on the entire top surface of the substrate 1. The diffusion barrier insulating layer 11 may be formed using a deposition technique with a poor step coverage property, such as sputtering or physical vapor deposition (PVD). The diffusion barrier insulating layer 11 may be formed to be thick on the first and second conductive patterns 10a and 10b and to be thin between the first and second conductive patterns 10a and 10b, and thus, the diffusion barrier insulating layer 11 may define a first air gap region AG1 and a second air gap region AG2. A width of the second recess region R2 (e.g., D4) may be substantially the same as a distance between the first conductive patterns 10a (e.g., D1) and a depth of the second recess region R2 may be substantially the same as that of the first recess region R1. Therefore, a shape of the second air gap region R2 may be substantially the same as that of the first air gap region R1. As a result, the air gap can be formed in a region, in which interconnection lines are spaced apart from each other by a large distance. Thus, a signal transmission speed via the interconnection lines can increase and complications may not occur in a subsequent process be it wiring or material deposition.

FIGS. 8, 9, 10, 11 and 12 are cross-sectional views of semiconductor devices according to exemplary embodiments of the inventive concept.

Figure 8:
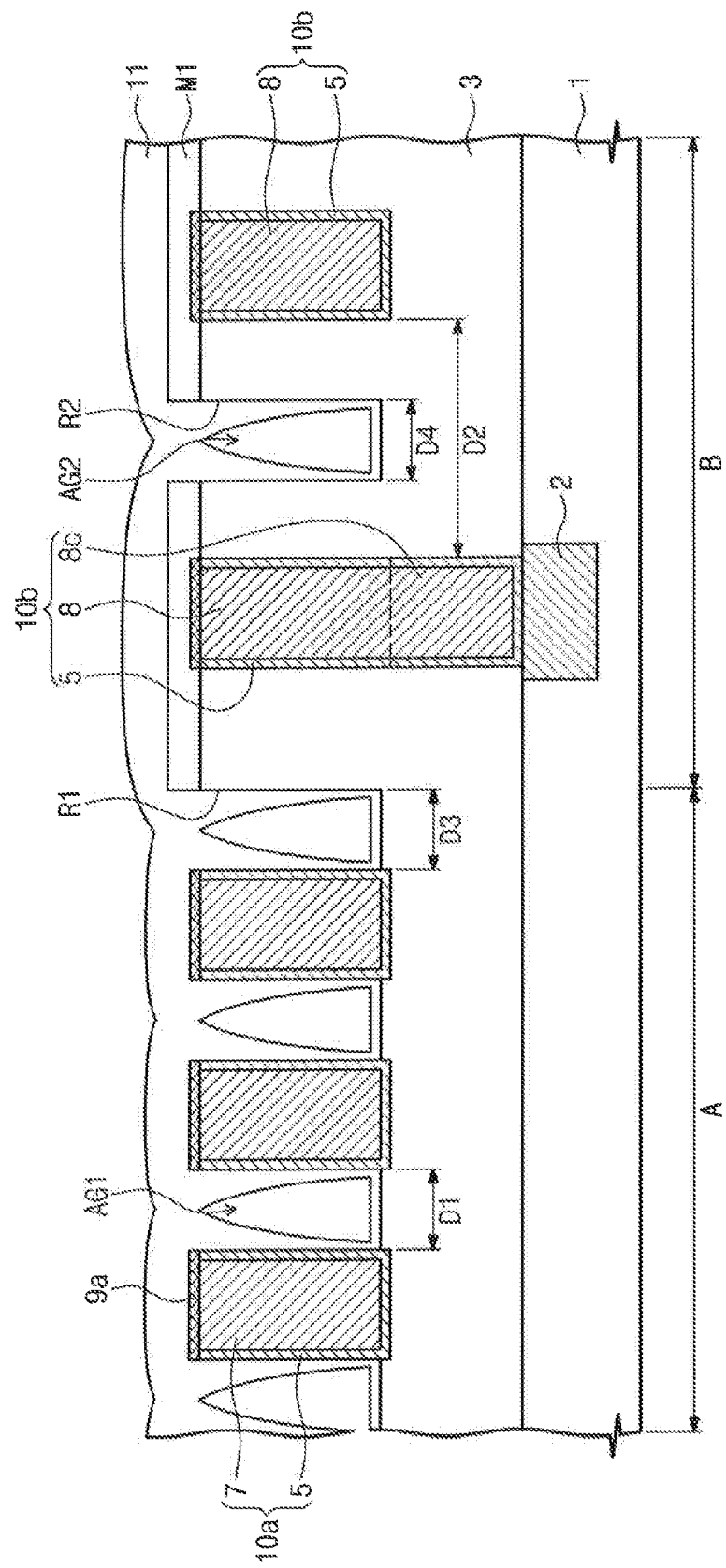
FIGS. 8, 9, 10, 11 and 12 are cross-sectional views of semiconductor devices according to exemplary embodiments of the inventive concept.

Referring to FIG. 8, the second protection layer 9b may not be disposed on the second region B of the interlayer insulating layer 3. The mask pattern M1 may be in direct contact with the interlayer insulating layer 3 at the sides of the second conductive patterns 10b. For the sake of brevity, the elements and features of FIG. 8 that are similar to those previously shown and described with reference to FIG. 2A will not be described.

In addition, the semiconductor device illustrated in FIG. 8 may have the same or similar features as those described with reference to FIG. 5. In other words, when a metal layer (e.g., cobalt (Co)) is deposited, the first protection layer 9a may be selectively formed on the first and second conductive patterns 10a and 10b and the second protection layer 9b may not be formed on the interlayer insulating layer 3. For the sake of brevity, the processes of FIG. 8 that are similar to those previously shown and described with reference to FIGS. 2A to 7 will not be described.

Figure 9:
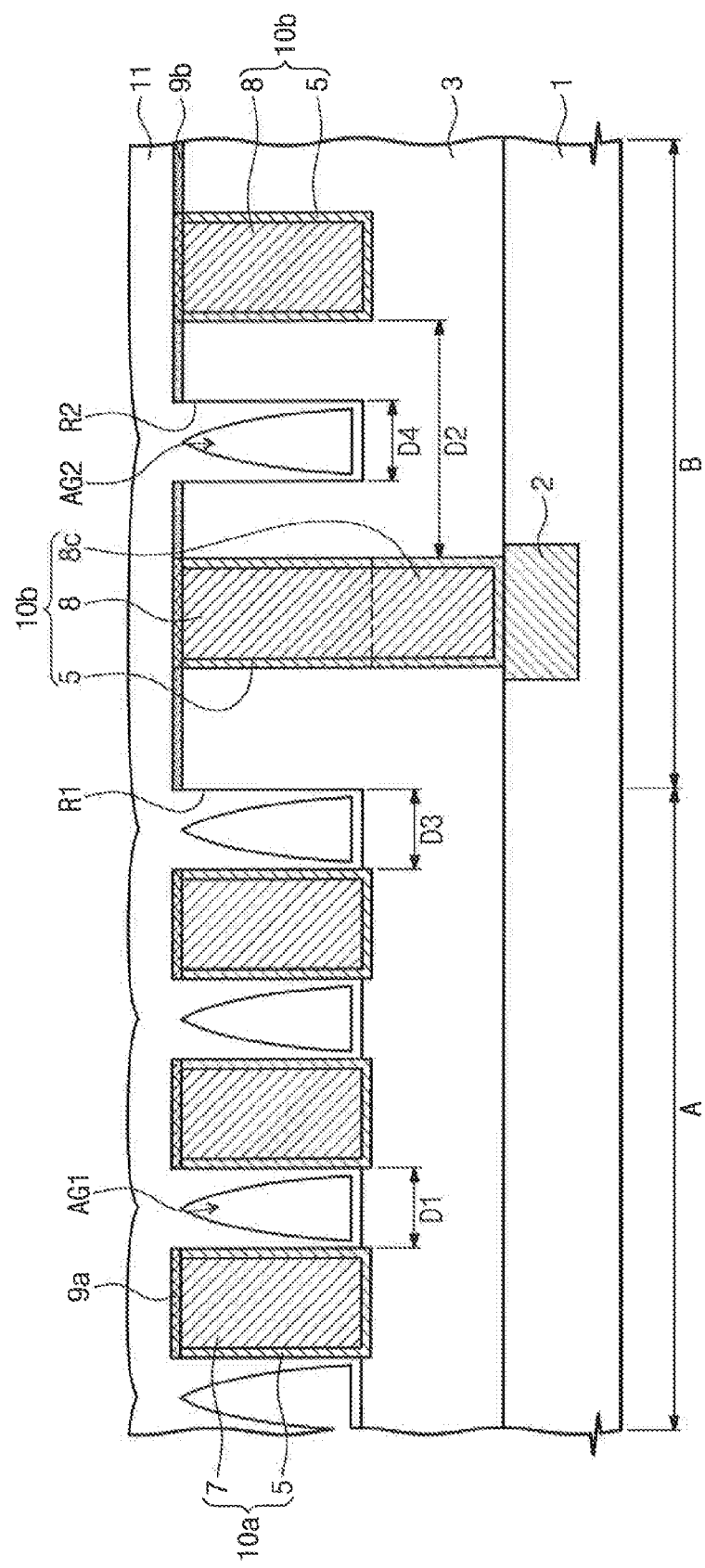

Referring to FIG. 9, the mask pattern M1 does not remain like in the semiconductor device illustrated FIG. 2A. In other words, the diffusion barrier insulating layer 11 on the second region B may be in direct contact with top surfaces of the first and the second protection layers 9a and 9b. For the sake of brevity, the elements and features of FIG. 9 that are similar to those previously shown and described with reference to FIG. 2A will not be described.

In addition, the semiconductor device illustrated in FIG. 9 may be formed by forming the diffusion barrier insulating layer 11 after removing the mask pattern M1 in the structure illustrated FIG. 7. For the sake of brevity, the processes of FIG. 9 that are similar to those previously shown and described with reference to FIGS. 2A to 7 will not be described.

Figure 10:
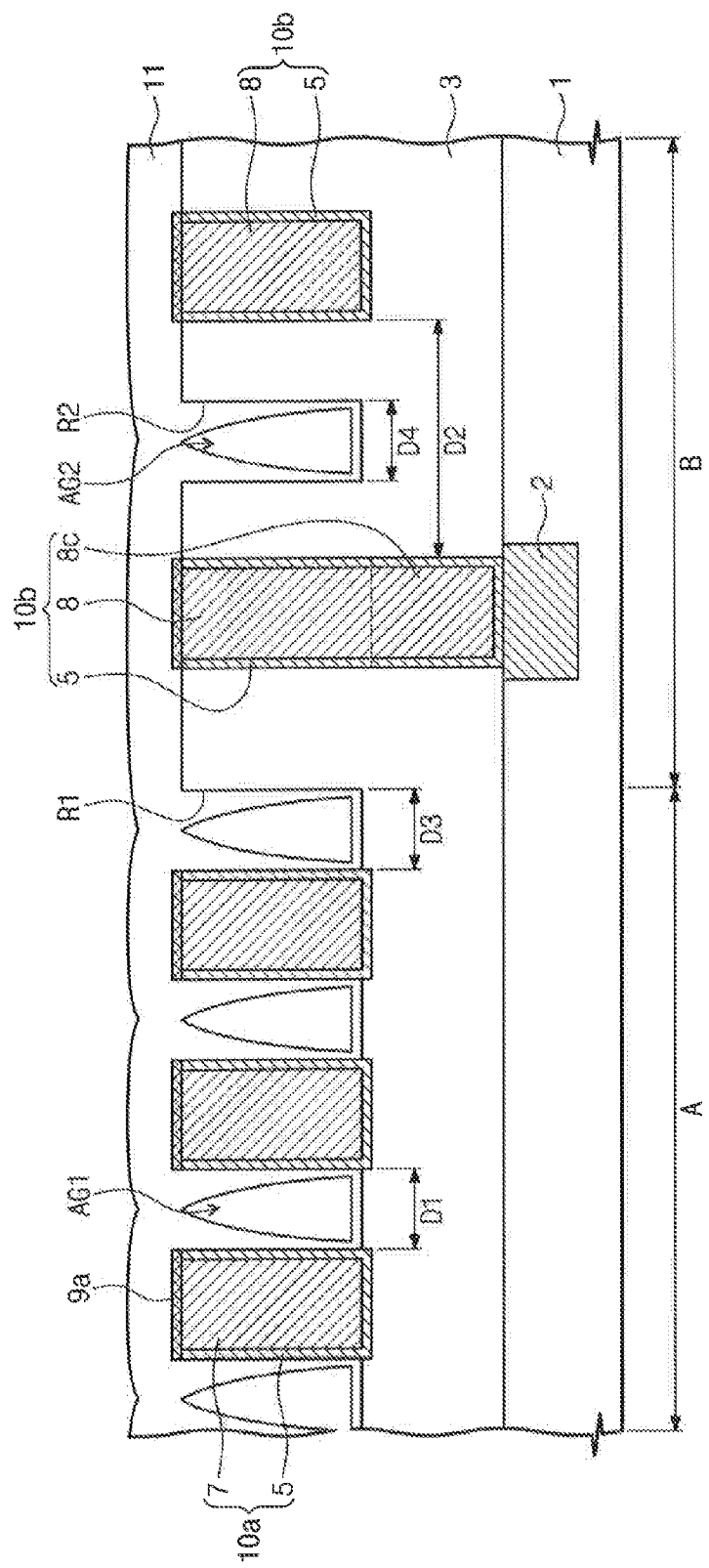

The semiconductor device illustrated in FIG. 10 does not include the mask pattern M1 in the structure illustrated in FIG. 8. In other words, the diffusion barrier insulating layer 11 may be in direct contact with the top surface of the first protection layer 9a in the second region B. For the sake of brevity, the elements and features of FIG. 10 that are similar to those previously shown and described with reference to FIG. 2A will not be described.

Figure 11:
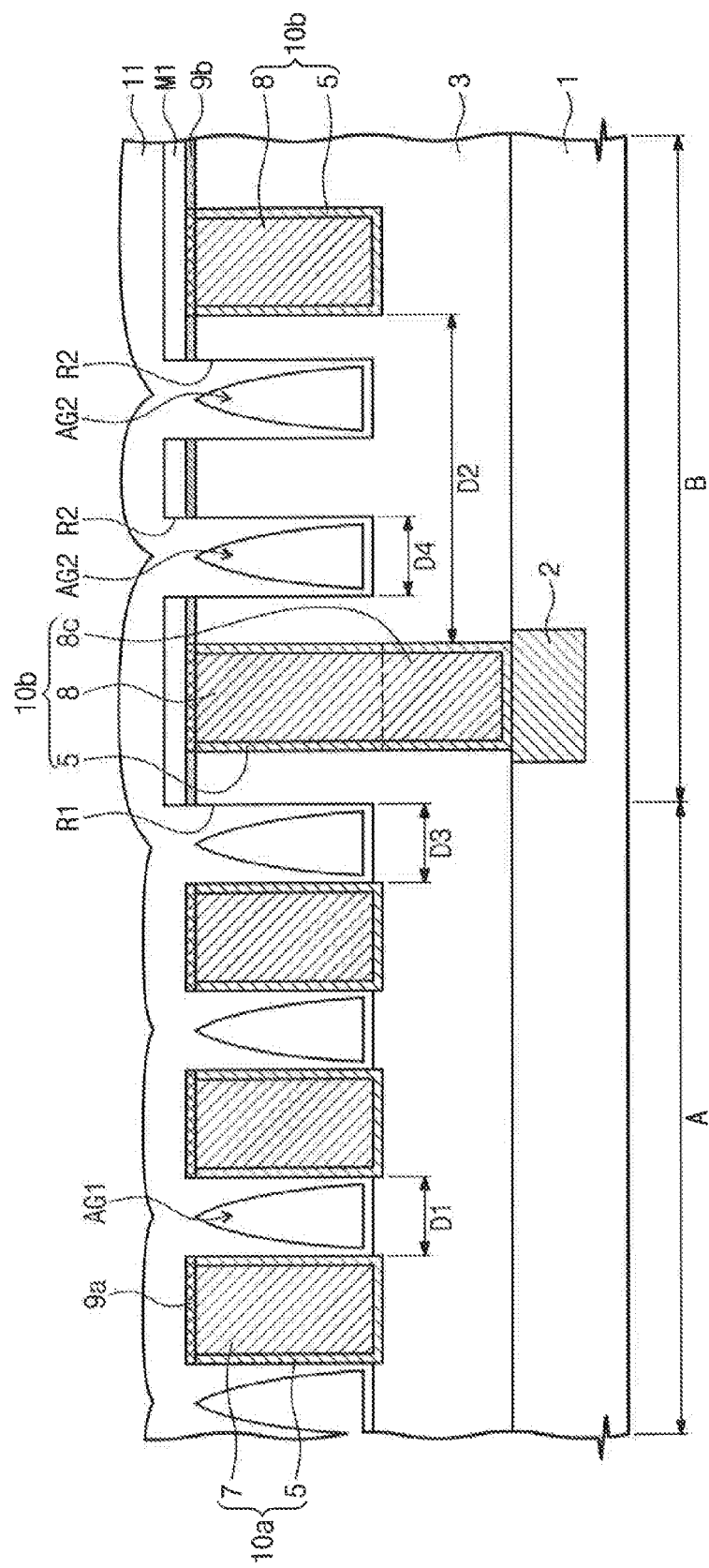

Referring to FIG. 11, two second recess regions R2 may be spaced apart from each other between the second conductive patterns 10b. Each of the second recess regions R2 may have a width D4 corresponding to the first distance D1. The second air gaps AG2 may be provided in the second recess regions R2, respectively. The number of the second recess regions R2 may be more than two. For the sake of brevity, the elements and features of FIG. 11 that are similar to those previously shown and described with reference to FIG. 2A will not be described.

Figure 12:
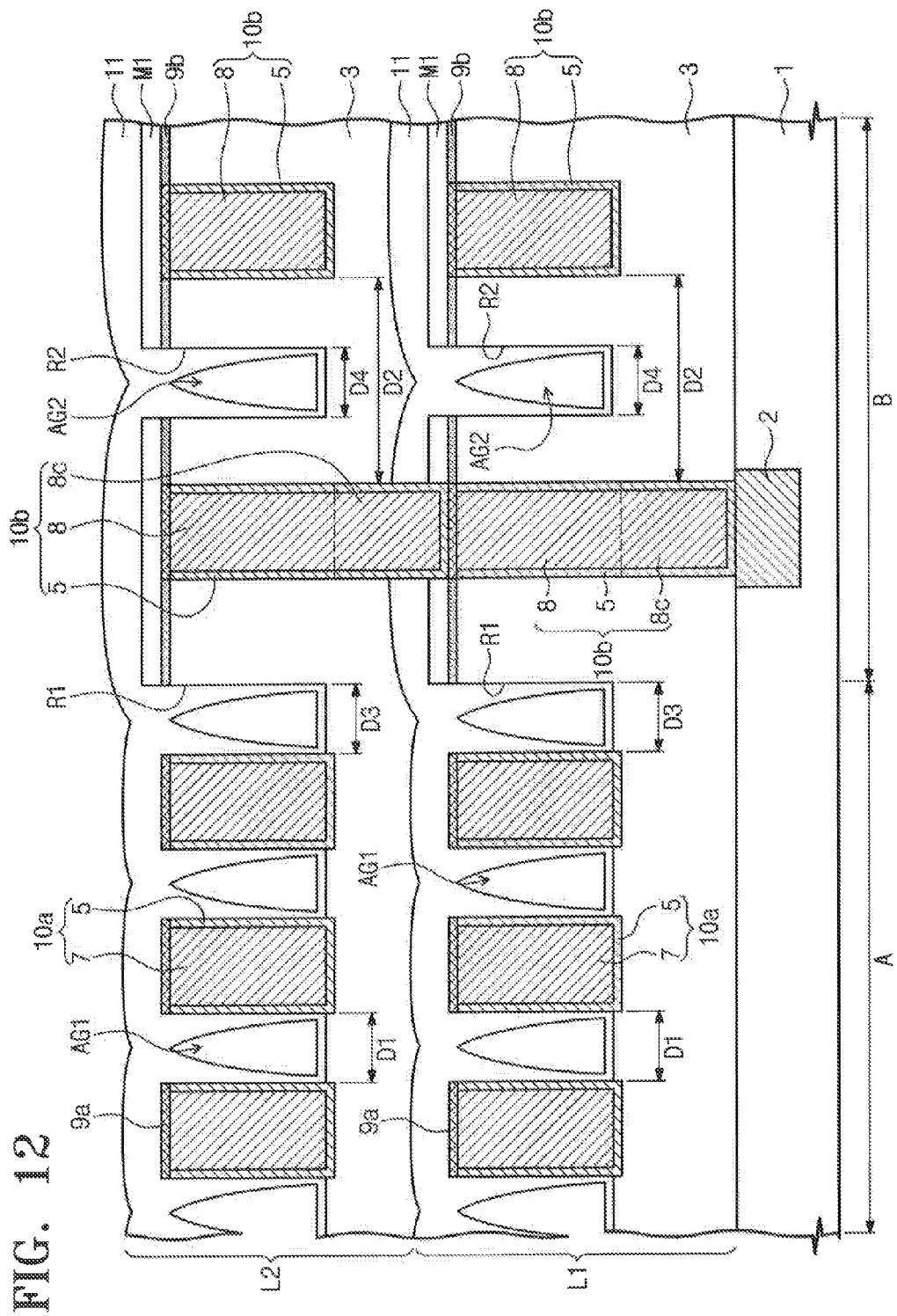

Referring to FIG. 12, a first interconnection structure L1 and a second interconnection structure L2 may be sequentially stacked on the substrate 1 including the first region A and the second region B. Each of the first and the second interconnection structures L1 and L2 are similar to the interconnection structure as illustrated in FIG. 2A. For the sake of brevity, the elements and features of FIG. 12 that are similar to those previously shown and described with reference to FIG. 2A will not be described.

Figure 13:
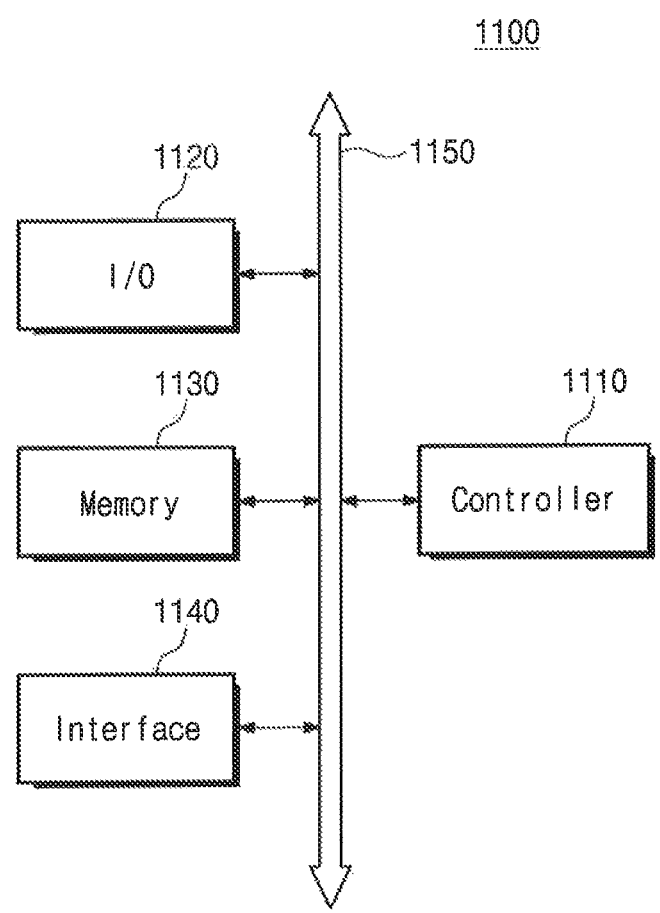
FIG. 13 is a schematic block diagram illustrating an example of a memory system that may include a semiconductor device according to an exemplary embodiment of the inventive concept.

FIG. 13 is a schematic block diagram illustrating an example of a memory system that may include a semiconductor device according to an exemplary embodiment of the inventive concept.

Referring to FIG. 13, a memory system 1100 according to an exemplary embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the 110 unit 1120, the memory device 1130, and/or the interface unit 1140 may include a semiconductor device according to an exemplary embodiment of the inventive concept.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit.

The memory device 1130 may store data and/or commands. The interface unit 1140 may transmit electrical data to a communication network or may receive electrical data from a communication network.

The interface unit 1140 may operate wirelessly or by cable. For example, the interface unit 1140 may include an antenna for wireless communication or a transceiver for cable communication. Although not shown in the drawings, the memory system 1100 may further include a fast dynamic random access memory (DRAM) device and/or a fast static random access memory (SRAM) device which acts as a cache memory for improving an operation of the controller 1110.

The memory system 1100 may be applied to a personal digital assistant (PDA), a portable computer, a web tablet, a wireless phone, a mobile phone, a digital music player, a memory card or other electronic products. The other electronic products may receive or transmit information data wirelessly.

According to an exemplary embodiment of the inventive concept, an air gap may be formed on a region, on which wirings are spaced apart from each other by a relatively large distance. This way, a signal transmission speed via the wirings can be increased. In addition, a top level of an air gap formed between interconnection lines spaced apart from each other by a relatively large distance may be similar to a top level of an air gap formed between interconnection lines spaced apart from each other by a relatively small distance. Therefore, abnormalities such as an electrical bridge between wirings may not occur in a subsequent wiring process for forming upper wirings.

While the inventive concept has been described with reference to exemplary embodiments thereof, it will be apparent to those skilled in the art that various changes and modifications may be made thereto without departing from the spirit and scope of the inventive concept as defined by the claims.

What is claimed is:

1. A semiconductor device, comprising:
   a substrate including a first region and a second region;
   an interlayer insulating layer disposed on the substrate;
   first conductive patterns disposed in the interlayer insulating layer of the first region and spaced apart from each other by a first distance; and
   second conductive patterns disposed in the interlayer insulating layer of the second region and spaced apart from each other by a second distance greater than the first distance,
   wherein the interlayer insulating layer includes at least one recess region disposed between the second conductive patterns, and the recess region has a width corresponding to the first distance.

2. The semiconductor device of claim 1, further comprising:
   a first air gap disposed between two of the first conductive patterns; and
   a second air gap disposed in the recess region.

3. The semiconductor device of claim 2, further comprising a diffusion barrier insulating layer overlapping a top surface of the interlayer insulating layer, a side surface of the recess region, and top and side surfaces of the first conductive patterns,
   wherein the first and second air gaps are formed by the diffusion barrier insulating layer.

4. The semiconductor device of claim 3, further comprising a mask pattern disposed between the diffusion barrier insulating layer and the top surface of the interlayer insulating layer and between the diffusion barrier insulating layer and top surfaces of the second conductive patterns.

5. The semiconductor device of claim 3, further comprising:
   a first protection layer disposed between the diffusion barrier insulating layer and top surfaces of the second conductive patterns; and
   a second protection layer disposed between the diffusion barrier insulating layer and the top surface of the interlayer insulating layer.

6. The semiconductor device of claim 3, wherein the diffusion barrier insulating layer is in contact with the top surface of the interlayer insulating layer.

7. The semiconductor device of claim 1, wherein at least one of the second conductive patterns includes a conductive plug and the recess region is spaced apart from the conductive plug.

8. A semiconductor device, comprising:
   a plurality of first conductive patterns disposed on a substrate and separated from each other by a first distance;
   a plurality of second conductive patterns disposed on the substrate and separated from each other by a second distance greater than the first distance;
   a diffusion barrier insulating layer disposed on top of the second conductive patterns; and
   an interlayer insulating layer disposed between the substrate and the diffusion barrier insulating layer, the interlayer insulating layer having a first recess disposed between two of the second conductive patterns.

9. The semiconductor device of claim 8, further comprising a protective layer that includes metal disposed between the diffusion barrier insulating layer and the interlayer insulating layer.

10. The semiconductor device of claim 8, wherein the diffusion barrier insulating layer includes silicon.

11. The semiconductor device of claim 8, wherein the first recess includes a first air gap.

12. The semiconductor device of claim 11, wherein a second recess is disposed between two of the first conductive patterns, and the first and second recesses have substantially the same width.

13. The semiconductor device of claim 12, wherein a second air gap is disposed in the second recess.

* * * * *